(12) United States Patent
Zhai et al.

(10) Patent No.: US 9,935,087 B2
(45) Date of Patent: *Apr. 3, 2018

(54) THREE LAYER STACK STRUCTURE

(71) Applicant: Apple Inc., Cupertino, CA (US)

(72) Inventors: Jun Zhai, Cupertino, CA (US);
Kunzhong Hu, Cupertino, CA (US)

(73) Assignee: APPLE INC., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/405,046

(22) Filed: Jan. 12, 2017

(65) Prior Publication Data
US 2017/0141088 A1    May 18, 2017

Related U.S. Application Data

(63) Continuation of application No. 14/804,261, filed on Jul. 20, 2015, now Pat. No. 9,601,471.

(Continued)

(51) Int. Cl.
*H01L 25/00* (2006.01)
*H01L 25/10* (2006.01)
(Continued)

(52) U.S. Cl.
CPC .......... *H01L 25/105* (2013.01); *H01L 21/561* (2013.01); *H01L 21/568* (2013.01); *H01L 23/3128* (2013.01); *H01L 23/3135* (2013.01); *H01L 23/5389* (2013.01); *H01L 24/13* (2013.01); *H01L 24/19* (2013.01); *H01L 24/20* (2013.01); *H01L 24/24* (2013.01); *H01L 24/73* (2013.01); *H01L 24/82* (2013.01); *H01L 24/92* (2013.01); *H01L 24/96* (2013.01); *H01L 24/97* (2013.01); *H01L 25/0652* (2013.01); *H01L 25/0657* (2013.01); *H01L 25/50* (2013.01); *H01L 2224/0401* (2013.01); *H01L 2224/04105* (2013.01); *H01L 2224/12105* (2013.01);
(Continued)

(58) Field of Classification Search
None
See application file for complete search history.

(56) References Cited

U.S. PATENT DOCUMENTS 8,253,244 B2    8/2012  Kang
8,288,209 B1   10/2012  Chi et al.
(Continued)

FOREIGN PATENT DOCUMENTS

EP    1 367 645 A2     12/2003
KR    2010 0107540 A   10/2010

OTHER PUBLICATIONS

PCT Invitation to Pay Additional Fees for International Application No. PCT/US2016/021405, dated May 25, 2016, 8 pages.
(Continued)

*Primary Examiner* — Daniel Whalen
(74) *Attorney, Agent, or Firm* — Rutan & Tucker, LLP

(57) ABSTRACT

Vertically stacked system in package structures are described. In an embodiment, a package includes a first level molding and fan out structure, a third level molding and fan out structure, and a second level molding and fan out structure between the first and third levels. The second level molding and fan out structure includes back-to-back facing die, with a front surface of each die bonded to a redistribution layer.

14 Claims, 11 Drawing Sheets

Related U.S. Application Data

(60) Provisional application No. 62/151,843, filed on Apr. 23, 2015.

(51) Int. Cl.
  *H01L 23/31* (2006.01)
  *H01L 21/56* (2006.01)
  *H01L 23/538* (2006.01)
  *H01L 23/00* (2006.01)
  *H01L 25/065* (2006.01)

(52) U.S. Cl.
  CPC .............. *H01L 2224/131* (2013.01); *H01L 2224/16227* (2013.01); *H01L 2224/16235* (2013.01); *H01L 2224/16237* (2013.01); *H01L 2224/24011* (2013.01); *H01L 2224/24105* (2013.01); *H01L 2224/24225* (2013.01); *H01L 2224/32145* (2013.01); *H01L 2224/32225* (2013.01); *H01L 2224/73204* (2013.01); *H01L 2224/73253* (2013.01); *H01L 2224/73267* (2013.01); *H01L 2224/81005* (2013.01); *H01L 2224/82005* (2013.01); *H01L 2224/82101* (2013.01); *H01L 2224/82106* (2013.01); *H01L 2224/83101* (2013.01); *H01L 2224/83855* (2013.01); *H01L 2224/83862* (2013.01); *H01L 2224/83874* (2013.01); *H01L 2224/92125* (2013.01); *H01L 2224/92225* (2013.01); *H01L 2224/92244* (2013.01); *H01L 2224/96* (2013.01); *H01L 2224/97* (2013.01); *H01L 2225/1023* (2013.01); *H01L 2225/1035* (2013.01); *H01L 2225/1041* (2013.01); *H01L 2225/1058* (2013.01); *H01L 2924/1431* (2013.01); *H01L 2924/1436* (2013.01); *H01L 2924/1437* (2013.01); *H01L 2924/1443* (2013.01); *H01L 2924/1451* (2013.01); *H01L 2924/14511* (2013.01)

(56) References Cited

U.S. PATENT DOCUMENTS

| | | |
|---|---|---|
| 8,754,514 B2 | 6/2014 | Yu et al. |
| 9,601,471 B2* | 3/2017 | Zhai ............... H01L 23/3128 |
| 2009/0160053 A1 | 6/2009 | Meyer et al. |
| 2012/0032340 A1 | 2/2012 | Choi et al. |
| 2013/0037950 A1* | 2/2013 | Yu ............... H01L 23/49816 257/738 |
| 2013/0105966 A1 | 5/2013 | Kelkar et al. |
| 2013/0260510 A1 | 10/2013 | Thuess |
| 2016/0013156 A1 | 1/2016 | Zhai et al. |

OTHER PUBLICATIONS

PCT International Search Report and Written Opinion for International Application No. PCT/US2016/021405, dated Aug. 22, 2016, 20 pages.

English machine translation of KR 2010 0107540 A, Oct. 6, 2010, 14 pages, available online Korean Intellectual Property Office http://www.kipris.or.kr/enghome/main.jsp, n.d.

* cited by examiner

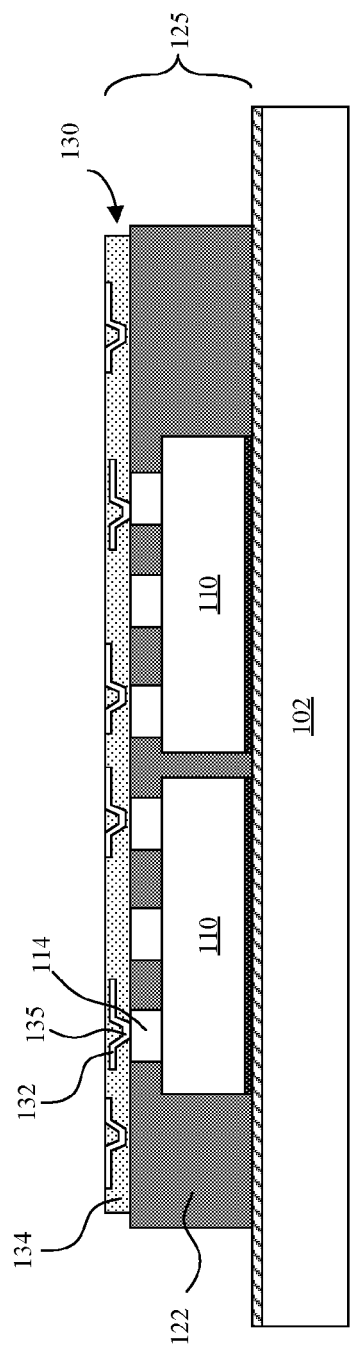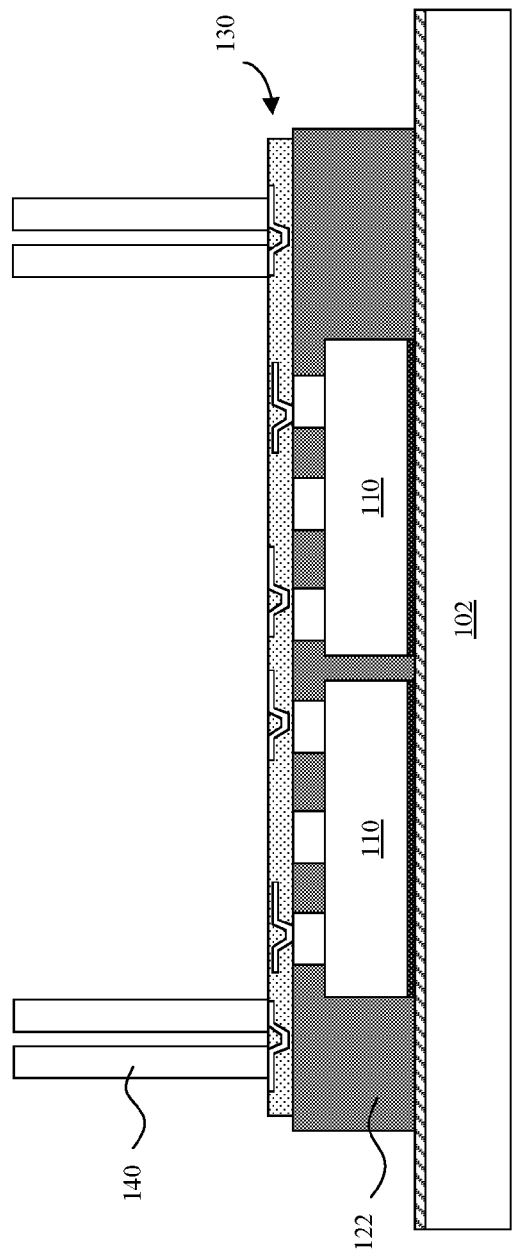
FIG. 3
FIG. 4

THREE LAYER STACK STRUCTURE

RELATED APPLICATIONS

This application is a continuation of co-pending U.S. patent application Ser. No. 14/804,261, filed Jul. 20, 2015, which claims the benefit of priority from U.S. Provisional Patent Application Ser. No. 62/151,843 filed on Apr. 23, 2015, the full disclosures of which are incorporated herein by reference.

BACKGROUND

Field

Embodiments described herein relate to semiconductor packaging. More particularly, embodiments relate to vertically stacked system in package (SiP) structures and methods of fabrication.

Background Information

The current market demand for portable and mobile electronic devices such as mobile phones, personal digital assistants (PDAs), digital cameras, portable players, gaming, and other mobile devices requires the integration of more performance and features into increasingly smaller spaces. As a result, various multiple-die packaging solutions such as system in package (SiP) and package on package (PoP) have become more popular to meet the demand for higher die/component density devices.

There are many different possibilities for arranging multiple die in an SiP. For example, vertical integration of die in SiP structures has evolved into 2.5D solutions and 3D solutions. In 2.5D solutions the multiple die may be flip chip bonded on an interposer that includes through vias as well as fan out wiring. In 3D solutions multiple die may be stacked on top of one another on an SiP substrate, and connected with off-chip wire bonds or solder bumps.

In one implementation, a memory die or package (e.g., dynamic random-access memory (DRAM)) is stacked on top of a logic die or package (e.g., application-specific integrated circuit (ASIC)) or system on chip (SoC). As the market for portable and mobile electronic devices advances larger memory capability is required of the memory die or package.

SUMMARY

In an embodiment, a vertical stack SiP includes a first level die encapsulated in a first level molding compound, a first redistribution layer (RDL) on the encapsulated first level die, a second level die stack including a pair of back-to-back stacked die on the first RDL and encapsulated in a second level molding compound, a second RDL on the encapsulated second level die stack, a third level die on the second RDL and encapsulated in a third level molding compound, where the third level die is back facing toward the second RDL, and a third RDL on the encapsulated third level die.

In accordance with embodiments, the particular orientations of the die are achieved within the SiP, which may be the result of particular packaging methods. In an embodiment, the third RDL is directly on a conductive bump, such as a stud bump, of the third level die. In an embodiment, the third RDL is directly on a contact pad of the third level die. The third level die may be attached to the second RDL with a die attach film. The first level die may be front facing toward the first RDL, with the first RDL directly on a conductive bump of the first level die. In accordance with embodiments, the pair of back-to-back stacked die may include a first-second level die bonded to the first RDL, and a second-second level die, with the second RDL on the second-second level die. For example, the first-second level die may be bonded to the first RDL with solder, and the second RDL may be directly on a conductive bump (e.g. stud bump) of the second-second level die.

The package levels may additionally include conductive pillars. For example, a plurality of second level conductive pillars can extend from the first RDL to the second RDL, and be encapsulated with the second level molding compound. Similarly, a plurality of third level conductive pillars may extend from the second RDL to the third RDL, and be encapsulated with the third level molding compound. In an embodiment, a plurality of conductive bumps is formed on an opposite side of the third RDL from the third level die. In an embodiment, a plurality of first level conductive pillars extend through the first level molding compound, and a second package is located on the first level molding compound and is electrically connected with and/or mechanically supported by the plurality of first level conductive pillars.

In an embodiment, a vertical stack SiP includes a first level volatile memory die encapsulated in a first level molding compound, a first RDL on the encapsulated first level volatile memory die, a second level non-volatile memory die stack including a pair of back-to-back stacked non-volatile memory die on the first RDL and encapsulated in a second level molding compound, a second RDL on the encapsulated second level non-volatile memory die stack, a third level active die on the second RDL and encapsulated in a third level molding compound, a third RDL on the encapsulated third level active die. The vertical stack SiP may include a plurality of the first level volatile memory die encapsulated in the first level molding compound, with the first RDL on the plurality of encapsulated first level volatile memory die. In an embodiment, the first level volatile memory die is a DRAM die, the back-to-back stacked non-volatile memory die are NAND die, and the third level active die is an SoC die.

In an embodiment, a method of forming a vertical stack SiP includes encapsulating a first level die on a carrier substrate with a first level molding compound, forming a first RDL on the first level molding compound, encapsulating a second level die stack on the first RDL with a second level molding compound, forming a second RDL on the second level molding compound, encapsulating a third level die on the second RDL with a third level molding compound, and forming a third RDL on the third level molding compound. For example, the first RDL may be formed directly on the first level die. In a first-second level die is bonded to the first RDL, and a second-second level die is attached to the first-second level die with a die attach film.

The fabrication methods may additionally include the integration of conductive pillars. In an embodiment, a plurality of second level conductive pillars are encapsulated with the second level molding compound, and the second RDL is formed directly on the second-second level die in the second level die stack and the plurality of second level conductive pillars. In an embodiment, a plurality of third level conductive pillars are encapsulated with the third level molding compound, and the third RDL is formed directly on the third level die and the plurality of third level conductive pillars.

BRIEF DESCRIPTION OF THE DRAWINGS

FIG. 3 is a cross-sectional side view illustration of a first RDL formed on a first level molding compound in accordance with an embodiment.

FIG. 4 is a cross-sectional side view illustration of conductive pillars formed on a first RDL in accordance with an embodiment.

DETAILED DESCRIPTION

Figure 1:
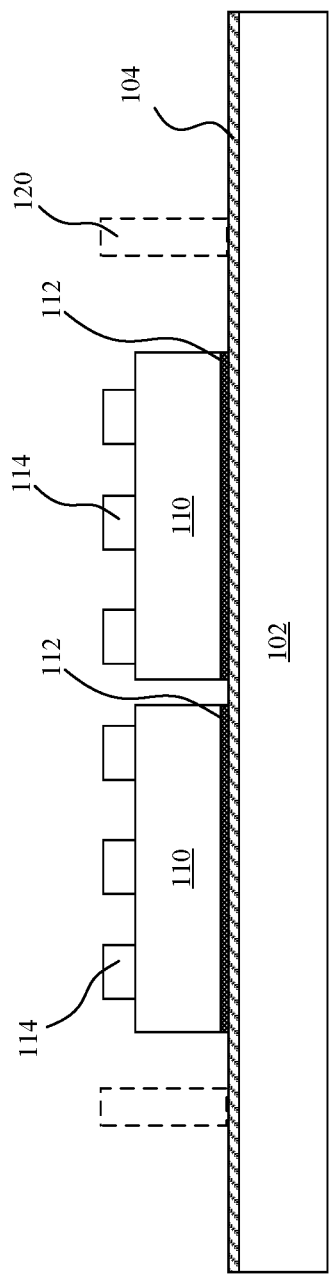
FIG. 1 is a cross-sectional side view illustration of a plurality of die mounted on a carrier substrate in accordance with an embodiment.

Embodiments describe vertically stacked SiP structures. In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "front", "back", "to", "between", and "on" as used herein may refer to a relative position of one layer with respect to other layers. One layer "on" another layer or bonded "to" or in "contact" with another layer may be directly in contact with the other layer or may have one or more intervening layers. One layer "between" layers may be directly in contact with the layers or may have one or more intervening layers.

In one aspect, embodiments describe a vertical stack SiP. In an embodiment, a vertical stack SiP includes a first level die encapsulated in a first level molding compound, a first redistribution layer (RDL) on the encapsulated first level die, a second level die stack including a pair of back-to-back stacked die on the first RDL and encapsulated in a second level molding compound, a second RDL on the encapsulated second level die stack, a third level die on the second RDL and encapsulated in a third level molding compound, and a third RDL on the encapsulated third level die. A plurality of second level conductive pillars may electrically connect the first RDL to the second RDL, and a plurality of third level conductive pillars may electrically connect the second RDL and the third RDL. In accordance with embodiments, conductive pillars (e.g. any of the first level, second level, third level, etc.) may provide mechanical support. For example, the mechanical support may be provided in addition to electrical connection between components, or without providing electrical connection. In some embodiments, a portion of the conductive pillars within a package level are to provide electrical connection and mechanical support, while another portion of the conductive pillars within the package level are to provide mechanical support without electrical connection.

In one aspect, embodiments describe a vertical stack SiP that integrates multiple types of memory die with a logic die (e.g. ASIC or SoC). In an embodiment, a vertical stack SiP includes separate molding levels for a volatile memory (e.g. DRAM, SRAM, pseudo SRAM, floating body, etc.), non-volatile memory (e.g. NAND, NOR, EPROM, EEPROM, MRAM, FRAM, PCM, etc.), and logic die. In an embodiment, a vertical stack SiP includes a first level molding including one or more volatile memory die (e.g. DRAM), a second level molding including back-to-back stacked non-volatile memory die (e.g. NAND), and a third level molding including a logic die (e.g ASIC or SoC).

In one aspect, embodiments described a vertical stack SiP that may reduce the amount of real estate (e.g. x-y dimensions) on a circuit board. It has been observed that certain non-volatile memory die (e.g. NAND) may have a larger x-y dimension footprint than certain volatile memory die (e.g. DRAM). For example, this may be attributed to an increased memory capacity in mobile devices. In accordance with embodiments, non-volatile memory die for memory may have larger x-y dimensions than volatile memory die (e.g. used for cache). In accordance with embodiments, a vertical stack SiP structure may include multiple first level die arranged side-by-side. In accordance with embodiments, a vertical stack SiP structure may include multiple second level die with a large x-y dimension (relative to the other die in the SiP) stacked back-to-back within the vertical stack SiP. Additionally, fan out of the back-to-back stacked die can be accomplished with the use of redistribution layers (RDLs) on opposite sides of the back-to-back stacked die. In this manner, the effect on total package height (z-height) can be mitigated with fan out using RDL, which can be fabricated with substantially less thickness than for traditional interposers and wire bonding.

Referring now to FIG. 1 a cross-sectional side view illustration is provided of a plurality of first level die 110 mounted on a carrier substrate 102, such as a glass panel, silicon wafer, metal panel, etc. The carrier substrate 102 may include an adhesive (e.g. polymer) or tape layer 104 for mounting the plurality of first level die 110. In an embodiment the first level die 110 are mounted onto the carrier substrate with a film 112 such as a die attach film or epoxy bonding material. In an embodiment, first level die 110 are memory die. In an embodiment, first level die 110 are volatile memory die such as DRAM, SRAM, pseudo SRAM, floating body, etc. In a specific embodiment, first level die 110 are DRAM die.

In the embodiment illustrated in FIG. 1, the first level die 110 are mounted onto the carrier substrate 102 face up, such that the active side including bumps 114 (e.g. stud bumps) is facing up. For example, stud bumps 114 may be copper stud bumps. Bumps 114 may be optional, and instead may be exposed contact pads for the first level die 110. In accordance with embodiments, first level conductive pillars 120 may optionally be formed on the carrier substrate 102. The material of optional first level conductive pillars 120 can include, but is not limited to, a metallic material such as copper, titanium, nickel gold, and combinations or alloys thereof. First level conductive pillars 120 may be formed using a suitable processing technique, and may be formed of a variety of suitable materials (e.g. copper) and layers. In an embodiment, first level conductive pillars 120 are formed by a plating technique, such as electroplating using a patterned photoresist to define the pillar structure dimensions, followed by removal of the patterned photoresist layer. In an embodiment, the optional first level conductive pillars 120 are formed prior to mounting of the first level die 110.

Figure 2:
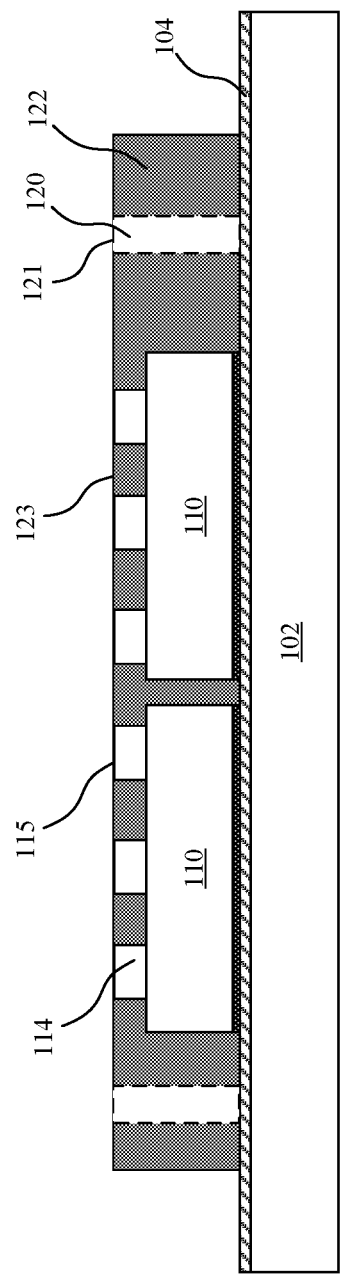
FIG. 2 is a cross-sectional side view illustration of a plurality of ide encapsulated in a first level molding compound in accordance with an embodiment.

Referring now to FIG. 2, the plurality of first level die 110 and optional first level conductive pillars 120 are then encapsulated in a first level molding compound 122 on the carrier substrate 102. For example, the first level molding compound 122 may include a thermosetting cross-linked resin (e.g. epoxy), though other materials may be used as known in electronic packaging. Encapsulation may be accomplished using a suitable technique such as, but not limited to, transfer molding, compression molding, and lamination. Following encapsulation with the first level molding compound 122, the structure may optionally be additionally processed with a grinding (e.g. chemical mechanical polishing) operation, etching operation, or patterned and etched to expose first level die 110 bumps 114, and optionally first level conductive pillars 120. In an embodiment, top surfaces 115, 123 of the bumps 114 and first level molding compound 122 (and optionally top surfaces 121 of first level conductive pillars 120) are coplanar after a grinding or etching operation. In an embodiment, bumps 114 may be replaced with contact pads of the first level die 110, which may be exposed, for example, by etching or laser drilling the first level molding compound 122.

Referring now to FIG. 3 a first redistribution layer (RDL) 130 is formed on the first level molding compound 122 and the exposed surfaces 115 of bumps 114 (or contact pads), and optionally exposed surfaces 121 of the first level conductive pillars, when present. The first RDL 130 may include a single redistribution line 132 or multiple redistribution lines 132 and dielectric layers 134. The first RDL 130 may be formed by a layer-by-layer process, and may be formed using thin film technology. In an embodiment, the first RDL 130 has a total thickness of less than 50 µm, or more specifically less than 30 µm, such as approximately 20 µm. In an embodiment, first RDL 130 includes embedded redistribution lines 132 (embedded traces). For example, the redistribution lines 132 may be created by first forming a seed layer, followed by forming a metal (e.g. copper) pattern. Alternatively, redistribution lines 132 may be formed by deposition (e.g. sputtering) and etching. The material of redistribution lines 132 can include, but is not limited to, a metallic material such as copper, titanium, nickel, gold, and combinations or alloys thereof. The metal pattern of the redistribution lines 132 is then embedded in a dielectric layer 134, which is optionally patterned. The dielectric layer(s) 134 may be any suitable material such as an oxide, or polymer (e.g. polyimide).

In the embodiment illustrated, redistribution lines 132 are formed directly on the top surfaces 115 of bumps 114 (or contact pads). More specifically, contact pads 135 of the redistribution lines 132 of the first RDL 130 are formed directly on the bumps 114 of first level die 110. Together, the first RDL 130, and molded first level die 110 may form a first level molding and fan out 125.

Following the formation of the first RDL 130 a plurality of second level conductive pillars 140 may be formed on the first RDL 130 as illustrated in FIG. 4. Second level conductive pillars 140 may be formed similarly, and of the same materials as described above with regard to the optional first level conductive pillars 120.

Figure 5A:
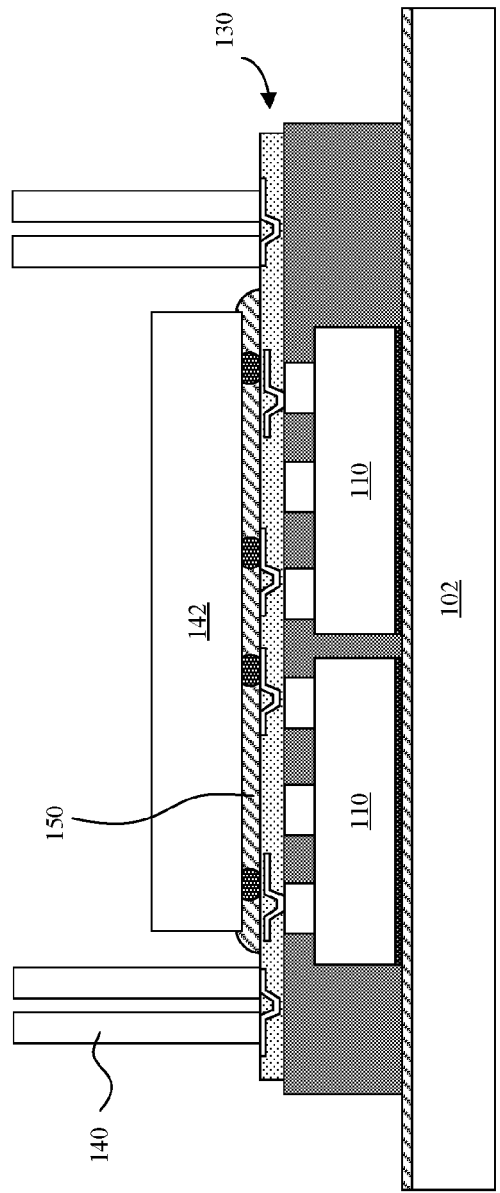
FIG. 5A is a cross-sectional side view illustration of a die mounted on a first RDL in accordance with an embodiment.

Referring now to FIG. 5A one or more second level die 142 are mounted on the first RDL 130. In an embodiment, the second level die 142 is a non-volatile memory die, such as (e.g. NAND, NOR, EPROM, EEPROM, MRAM, FRAM, PCM, etc.). In a specific embodiment, second level die 142 is a NAND die. In an embodiment, second level die 142 is wider, with larger x-y area, than either of the first level die 110. In the embodiment illustrated in FIG. 5A, second level die 142 is front facing toward the first RDL 130 and is attached to landing pads or underbump metallurgy (UBM) pads of the first RDL 130 with conductive bumps, such as stud bumps, solder bumps, or stud bumps with solder tips. In an embodiment, the back side of the second level die 142 does not include any conductive contacts (e.g. stud bumps, solder bumps, etc.).

Figure 5C:
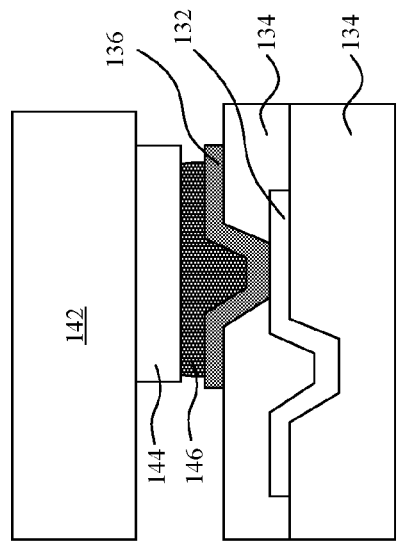
FIG. 5C is a close up cross-sectional side view illustration of a die bonded to a first RDL with UBM defined landing pads in accordance with an embodiment.
Figure 5B:
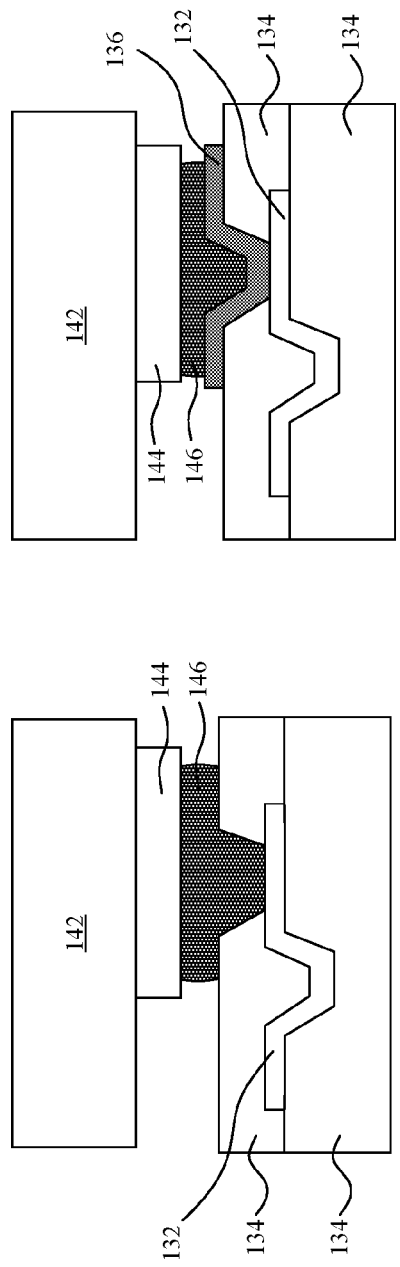
FIG. 5B is a close up cross-sectional side view illustration of a die bonded to a first RDL with polymer defined landing pads in accordance with an embodiment.

The landing pads or UBM pads can be formed in the first RDL 130 in a variety of ways. FIG. 5B is a close up illustration of a second level die 142 bonded to a first RDL in which landing pad openings have been defined by openings in a dielectric layer 134. In the particular embodiment illustrated, the second level die 142 bumps include stud bumps 144 with solder tips 146. FIG. 5C is a close up illustration of a second level die 142 including stud bumps 144 with solder tips 146 bonded to a first RDL in which the landing pads are defined by UBM pads 136. Referring now back to FIG. 5A, following mounting of the second level die 142 to the first RDL 130, an underfill material 150 may optionally be applied to between the second level die 142 and first RDL 130.

Figure 6:
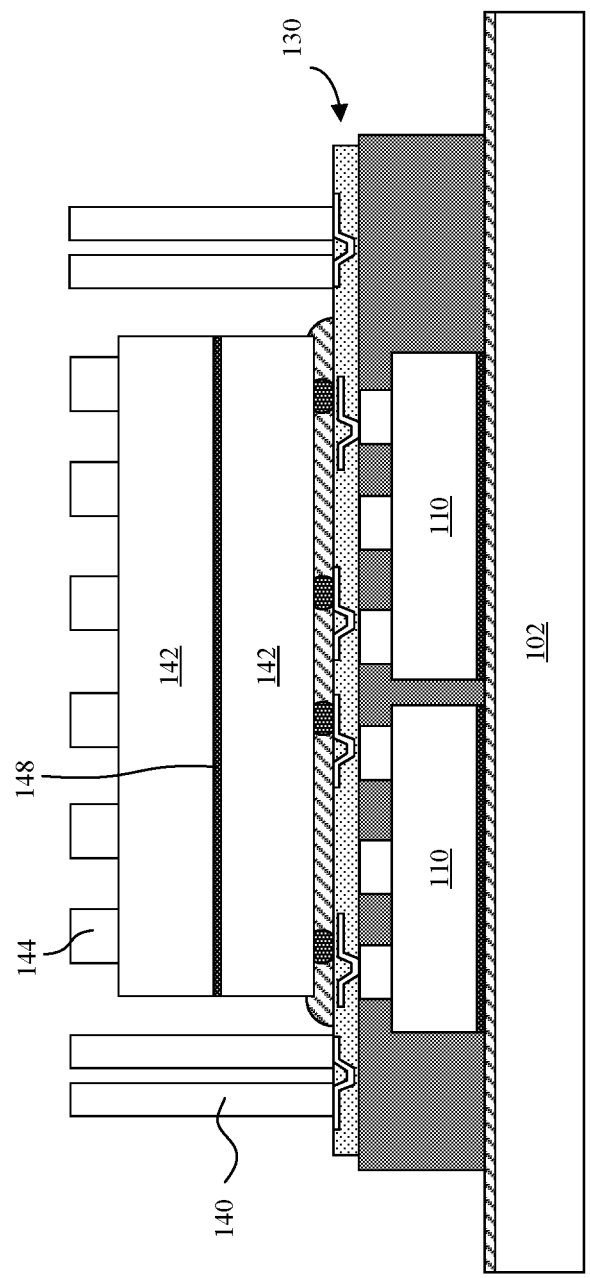
FIG. 6 is a cross-sectional side view illustration of a die stack mounted on a first RDL in accordance with an embodiment.

Referring now to FIG. 6, a second-second level die 142 is attached to the first-second level die 142. In the particular embodiment illustrated, a back side of the second-second level die 142 is attached to a back side of the first-second level die 142 in a back-to-back arrangement. The second level die 142 may be attached to each other using a die attach film (DAF) 148, for example. DAF 148 may be an adhesive material, and may optionally be thermally conductive. DAF may optionally be cured after die attachment through chemical, thermal or ultraviolet light, for example.

In an embodiment, the first (e.g. top in FIG. 6) and second (e.g. bottom in FIG. 6) second level die 142 are identical. For example, each second level die 142 may be the same NAND die. In an embodiment, the stacked second level die 142 are the same, with one exception being a modification to the stud bumps. For example, the top second level die 142

(as shown in FIG. 6) may include stud bumps 144 without solder tips (or alternatively contact pads where stud bumps are not present), while the bottom second level die 142 (as shown in FIG. 6) includes stud bumps 144 with solder tips 146, as illustrated in FIGS. 5B-5C.

Figure 7:
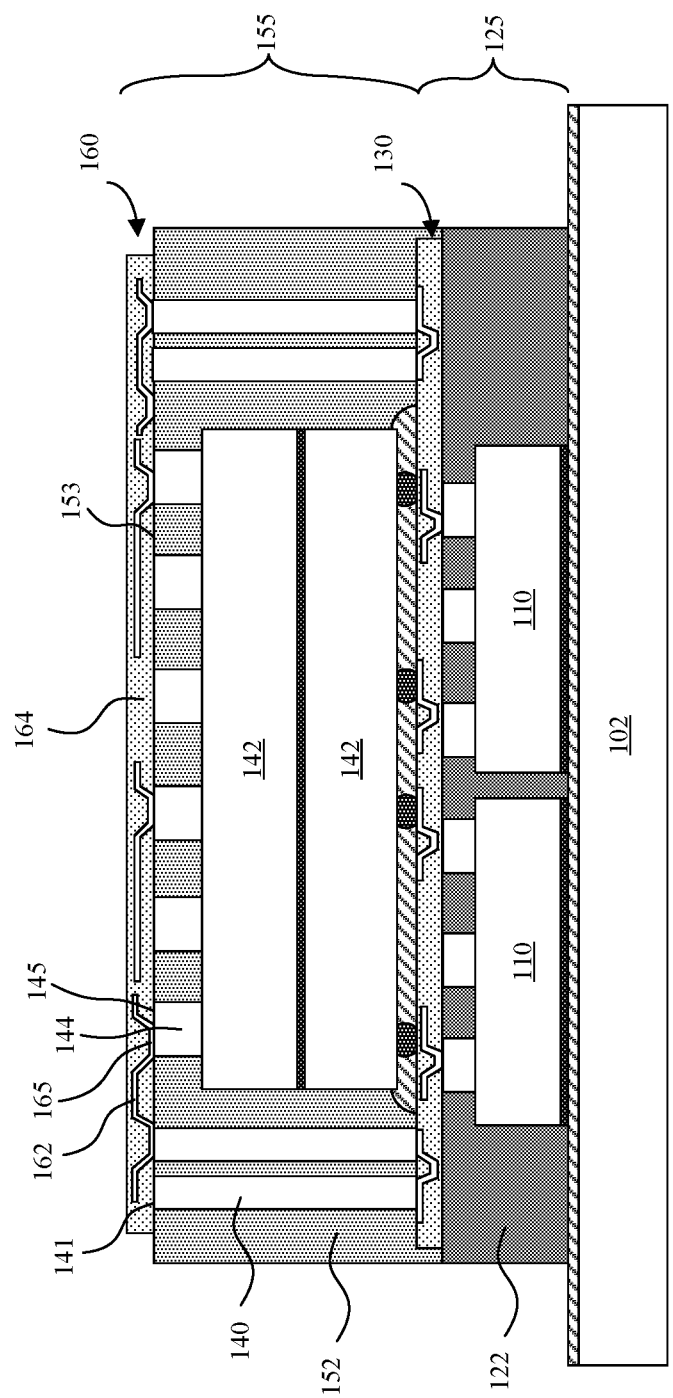
FIG. 7 is a cross-sectional side view illustration of a second level molding and fan out structure on a first level molding and fan out structure.

Referring now to FIG. 7, second level die 142 stack and second level conductive pillars 140 are encapsulated in a second level molding compound 152 on the carrier substrate 102. Referring briefly to FIG. 9B, the second level molding compound 152 may optionally surround the first level molding compound 122, though this is not required. The second level molding compound 152 may be formed similarly as, and from the same material as the first level molding compound 122. Following encapsulation with the second level molding compound, the structure may optionally be processed with a grinding operation, etching operation, or patterned and etched to expose the top second level die 142 bumps 144 (or contact pads if bumps are not present), and second level conductive pillars 140. In an embodiment, the top surfaces 145 of the bumps 144, the top surface 153 of the second level molding compound 152, and the top surfaces 141 of the second level conductive pillars 140 are coplanar after a grinding or etching operation.

A second redistribution layer (RDL) 160 is then formed on the second level molding compound 152, the exposed surfaces 145 of bumps 144 (or contact pads), and the exposed surfaces 141 of the second level conductive pillars 140. The second RDL 160 may include a single redistribution line 162 or multiple redistribution lines 162 and dielectric layers 164. The second RDL 160 may be formed by a layer-by-layer process, and may be formed using thin film technology. In an embodiment, the second RDL 160 has a total thickness of less than 50 µm, or more specifically less than 30 µm, such as approximately 20 µm. In an embodiment, second RDL 160 includes embedded redistribution lines 162 (embedded traces). For example, the redistribution lines 162 may be created by first forming a seed layer, followed by forming a metal (e.g. copper) pattern. Alternatively, redistribution lines 162 may be formed by deposition (e.g. sputtering) and etching. The material of redistribution lines 162 can include, but is not limited to, a metallic material such as copper, titanium, nickel, gold, and combinations or alloys thereof. The metal pattern of the redistribution lines 162 is then embedded in a dielectric layer 164, which is optionally patterned. The dielectric layer(s) 164 may be any suitable material such as an oxide, or polymer (e.g. polyimide).

In the embodiment illustrated, redistribution lines 162 are formed directly on the top surfaces 145 of bumps 144 (or contact pads where bumps are not present). More specifically, contact pads 165 of the redistribution lines 162 of the second RDL 160 are formed directly on the bumps 144 of the top second level die 142. Together, the second RDL 160, and molded second level stacked die 142 may form a second level molding and fan out 155. Redistribution lines 162 may also be formed directly on the surfaces 141 of the plurality of second level conductive pillars 140.

Figure 8:
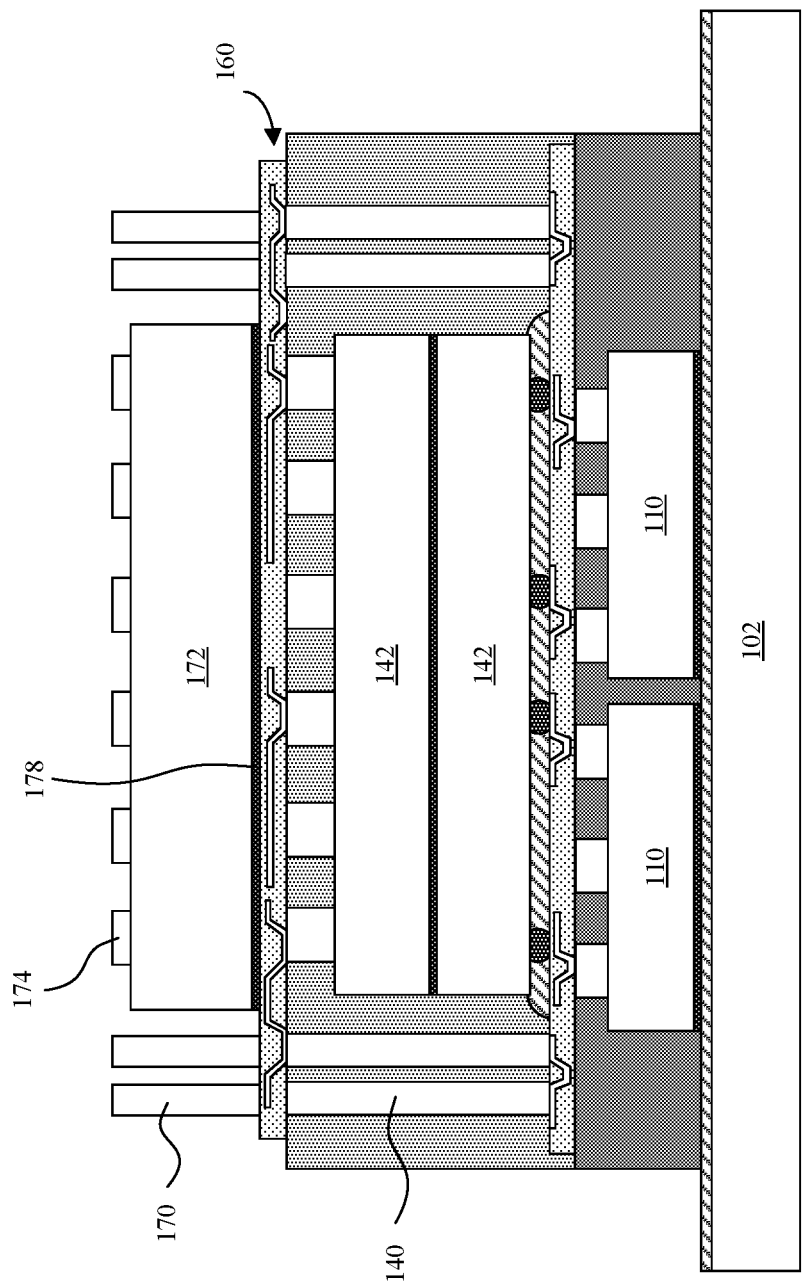
FIG. 8 is a cross-sectional side view illustration of a die mounted on a second RDL and conductive pillars formed on the second RDL in accordance with an embodiment.

Following the formation of the second RDL 160 a plurality of third level conductive pillars 170 may be formed on the second RDL 160 as illustrated in FIG. 8. Third level conductive pillars may be formed similarly, and of the same materials as described above with regard to the optional first level conductive pillars 120.

Still referring to FIG. 8, one or more third level die 172 are mounted on the second RDL 160. For example, the one or more third level die 172 may be mounted after the formation of third level conductive pillars 170. In an embodiment, the third level die 172 is a logic die, such as an ASIC or SoC. In an specific embodiment, third level die 172 is an SoC die. As shown in FIG. 8, third level die 172 may be back facing to the second RDL 160. In such an arrangement, the third level die 172 may be attached to the second RDL 160 with a DAF 178, similar to DAF 148 described above. Third level die 172 may include bumps 174, such as stud bumps (e.g. copper stud bumps). Alternatively, third level die 172 may include exposed contact pads in place of bumps 174.

Figure 9A:
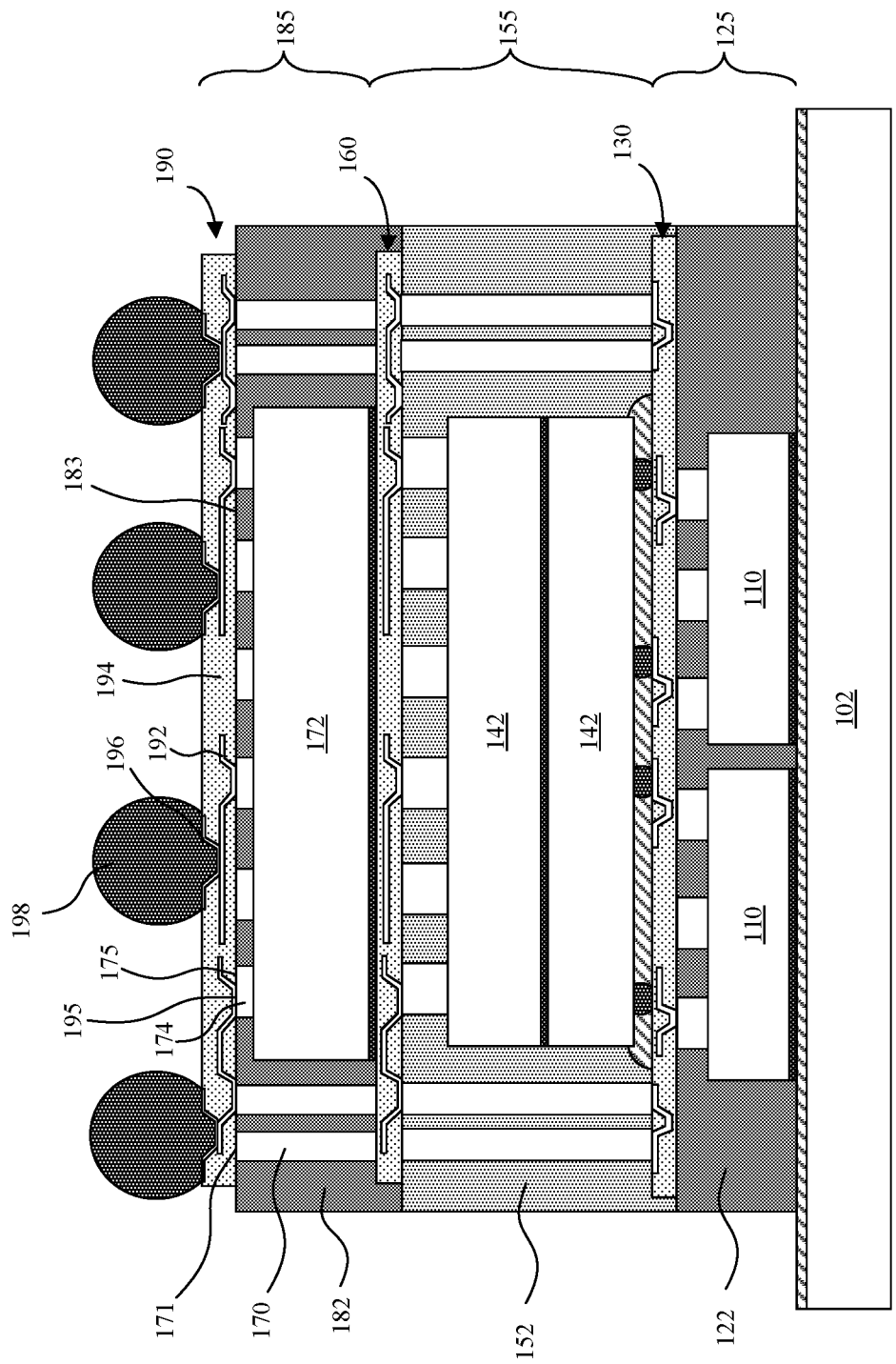
FIG. 9A is a cross-sectional side view illustration of a third level molding and fan out structure on a second level molding and fan out structure.
Figure 9B:
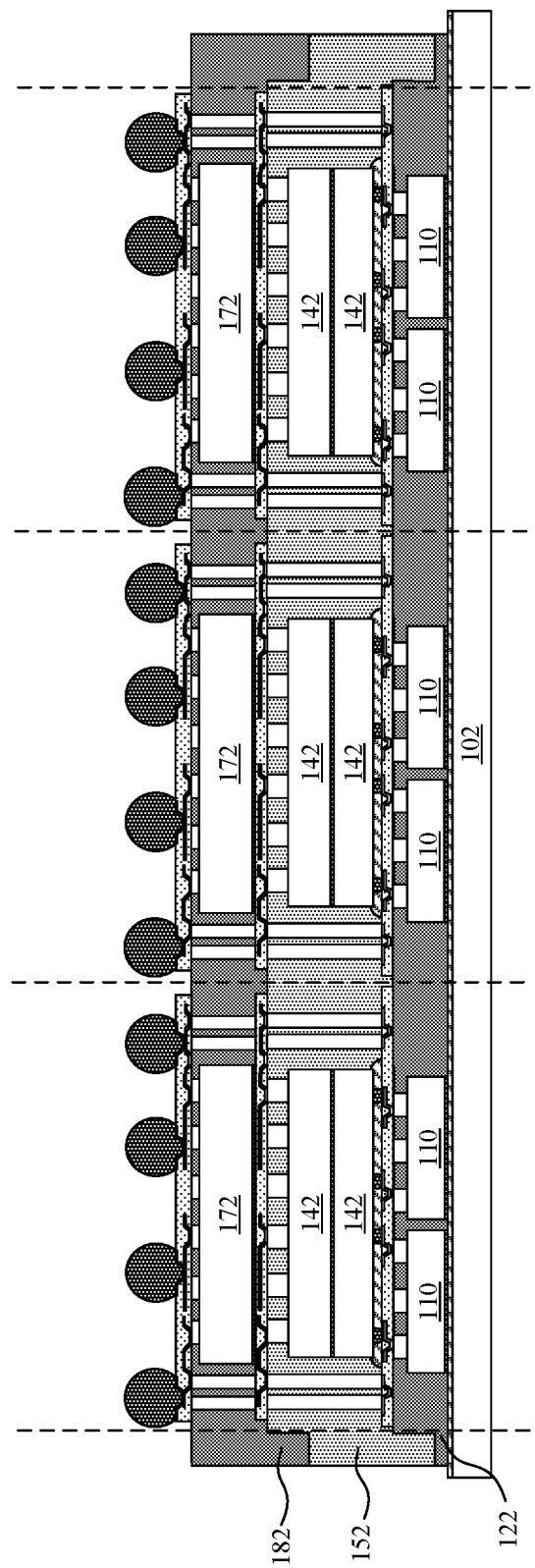
FIG. 9B is a cross-sectional side view illustration of a three layer stack structure prior to singulation of individual packages in accordance with an embodiment.

Referring now to FIG. 9A, third level die 172 and third level conductive pillars 170 are encapsulated in a third level molding compound 182 on the carrier substrate 102. Referring briefly to FIG. 9B, the third level molding compound 182 may optionally surround the first and second level molding compounds 122, 152, though this is not required. The third level molding compound 182 may be formed similarly as, and from the same material as the first and second level molding compounds 122, 152. Following encapsulation with the third level molding compound, the structure may optionally be processed with a grinding operation, etching operation, or patterned and etched to expose the third level die 172 bumps 174, (or contact pads) and third level conductive pillars 170. In an embodiment, the top surfaces 175 of the bumps 174, the top surface 183 of the third level molding compound 182, and the top surfaces 171 of the third level conductive pillars 170 are coplanar after a grinding or etching operation.

A third redistribution layer (RDL) 190 is then formed on the third level molding compound 182, the exposed surfaces 175 of bumps 174 (or contact pads), and the exposed surfaces 171 of the third level conductive pillars 170. The third RDL 190 may include a single redistribution line 192 or multiple redistribution lines 192 and dielectric layers 194. The third RDL 190 may be formed by a layer-by-layer process, and may be formed using thin film technology. In an embodiment, the third RDL 190 has a total thickness of less than 50 µm, or more specifically less than 30 µm, such as approximately 20 µm. In an embodiment, third RDL 190 includes embedded redistribution lines 192 (embedded traces). For example, the redistribution lines 192 may be created by first forming a seed layer, followed by forming a metal (e.g. copper) pattern. Alternatively, redistribution lines 192 may be formed by deposition (e.g. sputtering) and etching. The material of redistribution lines 192 can include, but is not limited to, a metallic material such as copper, titanium, nickel, gold, and combinations or alloys thereof. The metal pattern of the redistribution lines 192 is then embedded in a dielectric layer 194, which is optionally patterned. The dielectric layer(s) 194 may be any suitable material such as an oxide, or polymer (e.g. polyimide).

In the embodiment illustrated, redistribution lines 192 are formed directly on the top surfaces 175 of bumps 174. More specifically, contact pads 195 of the redistribution lines 192 of the third RDL 190 are formed directly on the bumps 174 (or contact pads) of die 172. Together, the third RDL 190, and molded third level die 172 may form a third level molding and fan out 185. Following the formation of the third RDL 190 a plurality of conductive bumps 198 (e.g. solder bumps, or stud bumps) may be formed on the third RDL 190.

Referring now to FIG. 9B, a cross-sectional side view illustration is provided of the three layer (or three level) stack structure in accordance with an embodiment prior to singulation of individual packages, in which the dotted lines illustrate singulation lines of individual packages. In an embodiment, edges of the molding compounds 122, 152 may be notched to accommodate a molding cavity for use during encapsulation. The notched area may sequentially be trimmed during singulation. The particular embodiment illustrated in FIG. 9B is exemplary, and a variety of molding configurations are possible. The same or different molding cavities may be used for the different molding levels. Additionally, the molding cavities can have the same or different depths (height), and area. In an embodiment, same molding cavity can be used for all molding levels.

Figure 10:
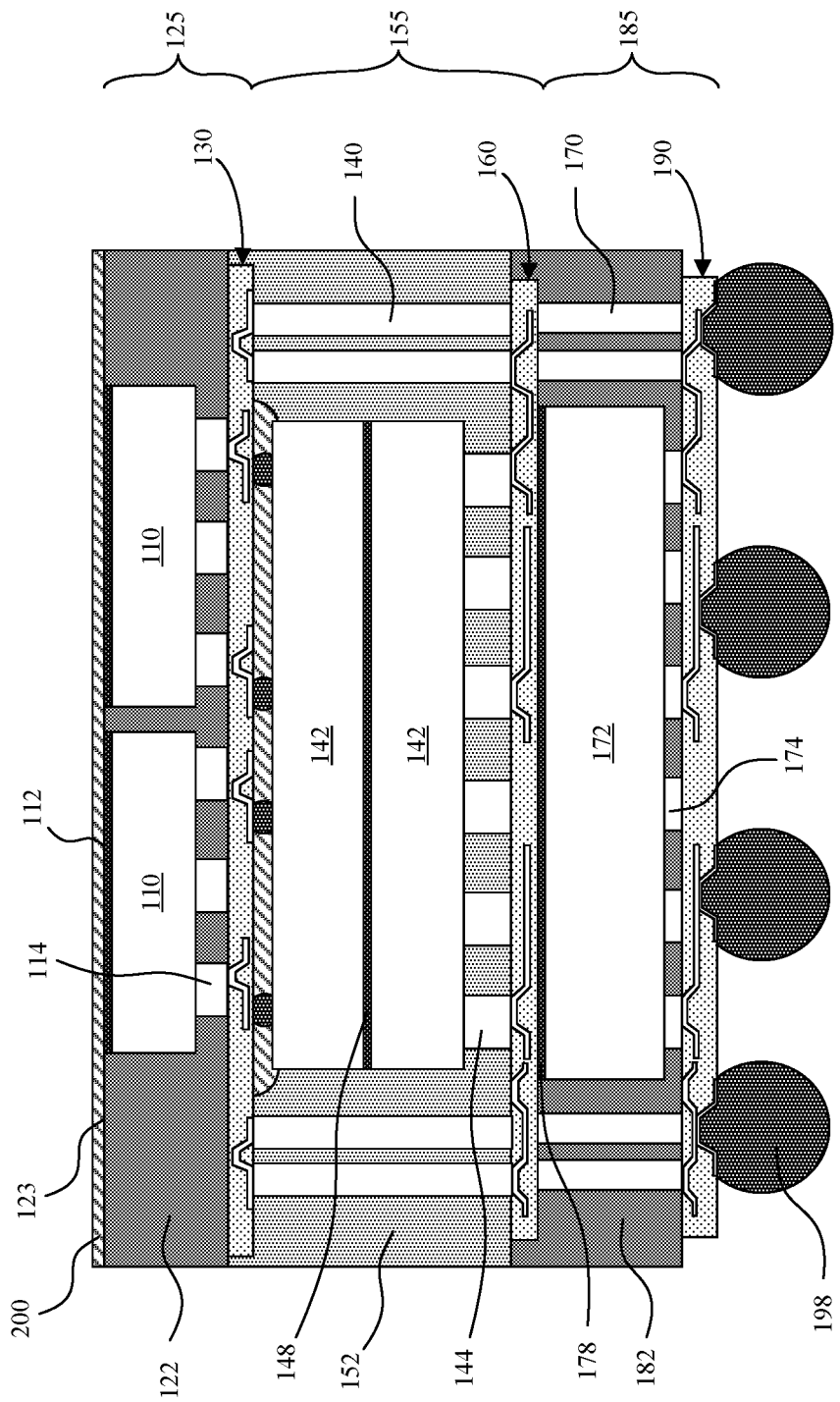
FIG. 10 is a cross-sectional side view illustration of a vertically stacked SiP structure in accordance with an embodiment.

FIG. 10 is a cross-sectional side view illustration of a vertically stacked SiP structure after removal of the carrier substrate and package singulation. In an embodiment, a vertically stacked SiP includes a first level die 110 encapsulated in a first level molding compound 122, a first redistribution layer (RDL) 130 on the encapsulated first level die 110, a second level die stack including a pair of back-to-back stacked die 142 on the first RDL 130 and encapsulated in a second level molding compound 152, a second RDL 160 on the encapsulated second level die stack, a third level die 172 on the second RDL 160 and encapsulated in a third level molding compound 182, and a third RDL 190 on the encapsulated third level die 172. A plurality of second level conductive pillars 140 may electrically connect the first RDL 130 to the second RDL 160, and a plurality of third level conductive pillars 170 may electrically connect the second RDL 160 and the third RDL 190. As shown, the third level die 172 is back facing toward the second RDL 160 (e.g. there are no conductive contacts on the back side of the third level die 172 facing the second RDL 160). In such a configuration, there is no direct electrical connection between the third level die 172 and the second RDL 160. For example, the third level die 172 may be attached to the second RDL with a die attach film 178. The third RDL 190 may be directly on a conductive bump 174 (e.g. stud bump) of the third level die 172. In an embodiment, an electrical path between the third level die 172 and the second RDL 160 runs through the third RDL 190 and third level conductive pillars 170 to the second RDL 160.

As shown, the first level die 110 is front facing toward the first RDL. The first RDL 130 may be directly on a conductive bump 114 (e.g. stud bump) of the first level die 110. There may be a plurality of side-by-side first level die 110. This may reduce total z-height of the package as opposed to vertically stacking the first level die 110. In an embodiment, the one or more first level die 110 are DRAM die.

The pair of back-to-back stacked die 142 may include a first-second level die 142 bonded to the first RDL 130, and a second-second level die 142, where the second RDL 160 is on the second-second level die 142. As shown, the first-second level die 142 may be bonded to the first RDL 130 with solder. The second RDL 160 may be directly on a conductive bump 144 (e.g. stud bump) of the second-second level die 142. The second-second level die 142 may be attached to the first-second level die 142 with a die attach film 148. In an embodiment, the pair of back-to-back stacked die 142 are non-volatile memory die, such as NAND die. In accordance with embodiments, the NAND die are stacked back-to-back, as opposed to side-by-side due to their comparatively large size. Thus, total package size, both x-y and z-height may be reduced using the back-to-back stacking configuration within the middle of the package.

A plurality of second level conductive pillars 140 may extend from the first RDL 130 to the second RDL 160, and be encapsulated within the second level molding compound 152. A plurality of third level conductive pillars 170 may extend from the second RDL 160 to the third RDL 190, and be encapsulated within the third level molding compound 182. A plurality of conductive bumps 198 may be formed on an opposite side of the third RDL 190 from the third level die 172. In an embodiment, the third level die 172 is attached to the second RDL 160 with a die attach film 178. In an embodiment, the one or more first level die 110 is a volatile memory die (e.g. DRAM), the pair of back-to-back stacked die 142 are non-volatile memory die (e.g. NAND), and the third level die is a logic die (e.g. SoC).

Still referring to FIG. 10, in an embodiment a passivation layer 200 is optionally formed over the first level molding compound 122 and first level die 110. For example, passivation layer 200 may be formed by lamination. In one embodiment the passivation layer 200 is formed after removal of the carrier substrate 102 and prior to singulation of the SiP structures. In another embodiment, the passivation layer 200 can be formed on the carrier substrate 102 illustrated in FIG. 1 prior to formation of the optional first level conductive pillars 120 and/or attachment of the first level die 110. For example, passivation layer 200 can be formed over the adhesive (e.g. polymer) or tape layer 104.

Figure 11:
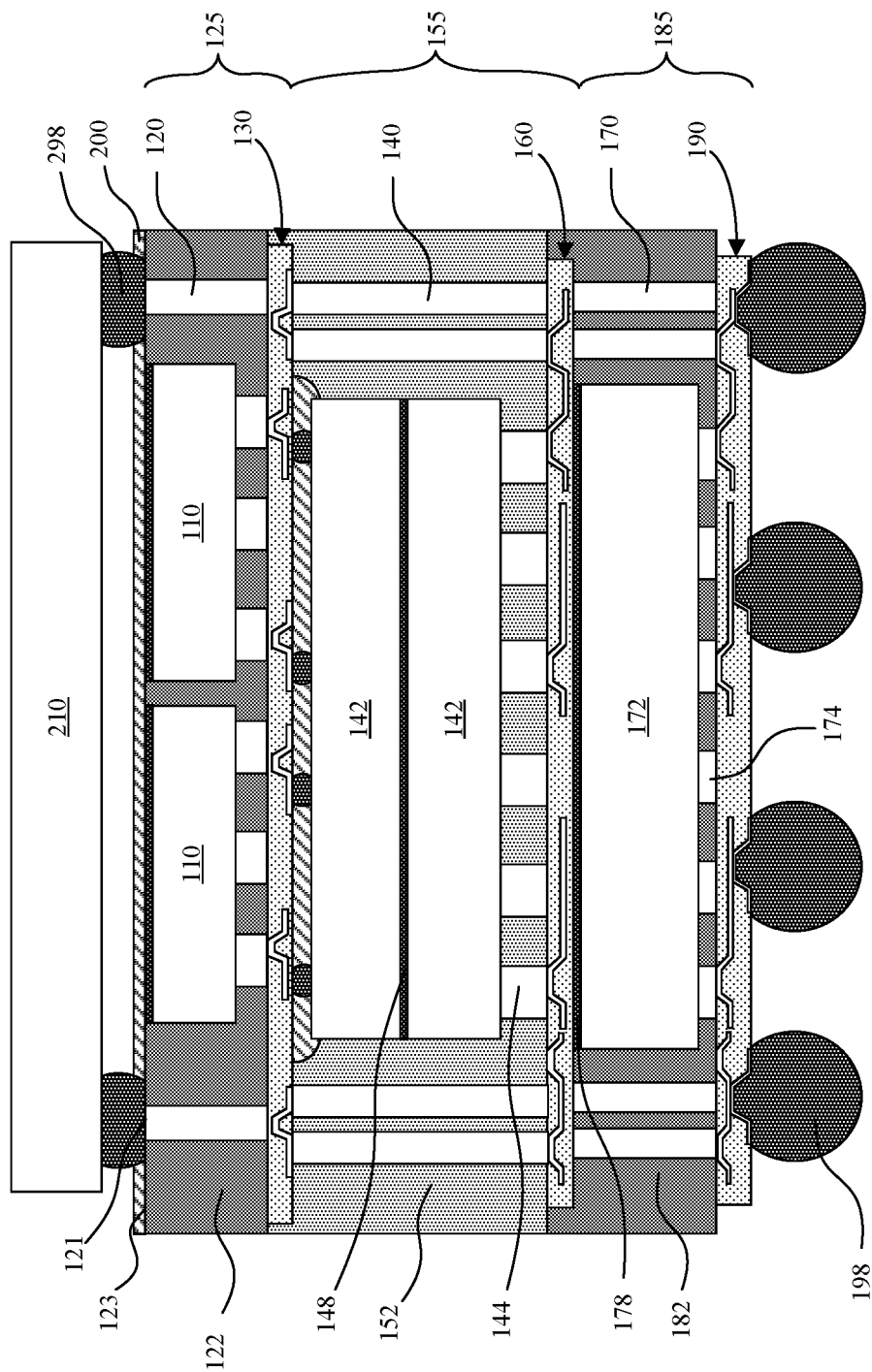
FIG. 11 is a cross-sectional side view illustration of a PoP structure in accordance with an embodiment.

FIG. 11 is a cross-sectional side view illustration of a PoP structure in accordance with an embodiment. As described with regard to FIGS. 1-2 first level conductive pillars 120 are optionally formed on the carrier substrate 102, and encapsulated with a first level molding compound 122. Upon removal of the carrier substrate 102, the first level conductive pillars 120 may be exposed. Additional processing such as grinding or etching may also be performed to expose the first level conductive pillars. As shown in FIG. 11, in an embodiment a second package 210 may be in electrical connection (e.g. bonded to with conductive bumps 198) the first level conductive pillars 120 extending through the first level molding compound 122 of the vertically stacked SiP structure to form a PoP structure.

Figure 12:
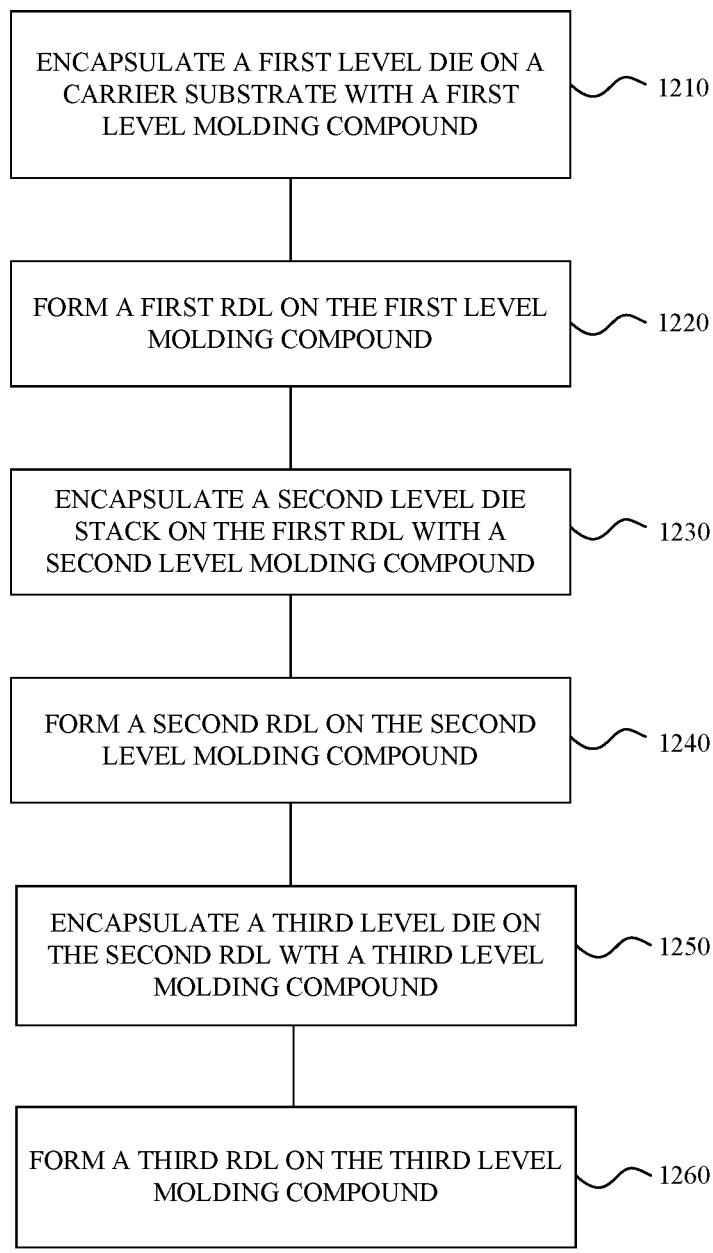
FIG. 12 is a process flow illustrating a method of forming a vertically stacked SiP structure in accordance with an embodiment.

FIG. 12 is a process flow illustrating a method of forming a vertically stacked system in package in accordance with an embodiment. At block 1210 a first level die is encapsulated on a carrier substrate with a first level molding compound, for example, similarly as described with regard to FIG. 2. At block 1220 a first RDL is formed on the first level molding compound, for example, similarly as described with regard to FIG. 3. In an embodiment, the first RDL is formed directly on the first level die. At block 1230 a second level die stack is encapsulated on the first RDL with a second level molding compound, for example, similarly as described with regard to FIGS. 4-6. In an embodiment, the second level die stack is formed by bonding a first-second level die to the first RDL, and attaching a second-second level die to the first-second level die with a die attach film. In an embodiment, a plurality of second level conductive pillars formed on the first RDL are encapsulated with the second level molding compound. At block 1240 a second RDL is formed on the second level molding compound, for example, similarly as described with regard to FIG. 6. In an embodiment, the second RDL is formed directly on the second-second level die in the second level die stack and the plurality of second level conductive pillars. At block 1250 a third level die is encapsulated on the second RDL with a third level molding compound, for example, similarly as described with regard to FIG. 9A. In an embodiment, a plurality of third level conductive pillars formed on the second RDL are encapsulated with the third level molding compound. At block 1260 a third RDL is formed on the third level molding compound. The third RDL may be formed directly on the third level die and the plurality of third level conductive pillars. A plurality of conductive bumps (e.g. solder balls) may be formed (e.g.

dropped) on the third RDL, and the carrier substrate may then be released. For example, this may result in a vertically stacked SiP structure similar to that described with regard to FIG. 10. Where first level conductive pillars are present, a second package can be stacked on the vertically stacked SiP structure to form a PoP structure, similar to that described with regard to FIG. 11.

In utilizing the various aspects of the embodiments, it would become apparent to one skilled in the art that combinations or variations of the above embodiments are possible for forming a stacked system in package structure. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A vertical stack system in package (SiP) comprising:
   a pair of first level dies encapsulated in a first level molding compound;
   a first redistribution layer (RDL) on the encapsulated pair of first level dies;
   a second level die stack including a pair of back-to-back stacked dies on the first RDL and encapsulated in a second level molding compound;
   a second RDL on the encapsulated second level die stack;
   a third level die on the second RDL and encapsulated in a third level molding compound, wherein the third level die is back facing toward the second RDL, wherein the third level die is attached directly to the second RDL with a die attach film that is in direct contact with the third level die and the second RDL; and
   a third RDL on the encapsulated third level die;
   wherein each of the first level dies is a first type of die and each of the back-to-back stacked dies is a second type of die that is different than the first type of die, and each of the back-to-back stacked dies have larger x-y dimensions than each of the first level dies.

2. The vertical stack SiP of claim 1, wherein the third RDL is directly on a stud bump of the third level die.

3. The vertical stack SiP of claim 1, wherein the third RDL is directly on a contact pad of the third level die.

4. The vertical stack SiP of claim 1, wherein each of the first level dies is front facing toward the first RDL and the first RDL is directly on a conductive bump for each of the first level dies.

5. The vertical stack SiP of claim 1, wherein the pair of back-to-back stacked dies includes a first-second level die bonded to the first RDL, and a second-second level die, wherein the second RDL is on the second-second level die.

6. The vertical stack SiP of claim 5, wherein the first-second level die is bonded to the first RDL with solder.

7. The vertical stack SiP of claim 6, wherein the second RDL is directly on a stud bump of the second-second level die.

8. The vertical stack SiP of claim 5, further comprising a plurality of second level conductive pillars extending from the first RDL to the second RDL, wherein the plurality of second level conductive pillars are encapsulated with the second level molding compound.

9. The vertical stack SiP of claim 8, further comprising a plurality of third level conductive pillars extending from the second RDL to the third RDL, wherein the plurality of third level conductive pillars are encapsulated with the third level molding compound.

10. The vertical stack SiP of claim 9, further comprising a plurality of conductive bumps on an opposite side of the third RDL from the third level die.

11. The vertical stack SiP of claim 9, further comprising:
    a plurality of first level conductive pillars extending through the first level molding compound; and
    a second package on the first level molding compound, and electrically connected with the plurality of first level conductive pillars.

12. The vertical stack SiP of claim 1, wherein the pair of back-to-back stacked dies includes a first-second level die bonded to the first RDL, and a second-second level die,
    wherein the first-second level die is bonded to the first RDL with solder and the second RDL is directly on a stud bump of the second-second level die.

13. The vertical stack SiP of claim 1, wherein the third level die is a third type of die that is different than both the first type of die and the second type of die.

14. The vertical stack SiP of claim 1 wherein:
    the first type of die is selected from the group consisting of DRAM, SRAM, pseudo SRAM, and floating body;
    the second type of die is selected from the group consisting of NAND, NOR, EPROM, EEPROM, MRAM, FRAM, and PCM; and
    the third type of die is selected from the group consisting of ASIC and SoC.

\* \* \* \* \*